United States Patent
Kinzer

[19]

[11] Patent Number: 5,886,383
[45] Date of Patent: Mar. 23, 1999

[54] INTEGRATED SCHOTTKY DIODE AND MOSGATED DEVICE

[75] Inventor: Daniel M. Kinzer, El Segundo, Calif.

[73] Assignee: International Rectifier Corporation, El Segundo, Calif.

[21] Appl. No.: 782,568

[22] Filed: Jan. 10, 1997

[51] Int. Cl.⁶ .......................... H01L 29/76; H01L 29/94; H01L 31/062; H01L 31/113
[52] U.S. Cl. .......................... 257/341; 2517/343
[58] Field of Search ................... 257/341, 327, 257/328, 401, 342, 268, 343

[56] References Cited

U.S. PATENT DOCUMENTS

| | | |
|---|---|---|
| 4,466,176 | 8/1984 | Temple ..................................... 257/341 |
| 4,503,598 | 3/1985 | Vora et al. ............................... 257/341 |
| 4,521,795 | 6/1985 | Coe et al. ................................ 257/341 |
| 4,631,564 | 12/1986 | Neilson et al. .......................... 257/341 |
| 4,837,606 | 6/1989 | Goodman et al. ....................... 257/341 |
| 5,223,732 | 6/1993 | Clark ....................................... 257/341 |
| 5,631,484 | 5/1997 | Isoi et al. ................................ 257/341 |

*Primary Examiner*—Olik Chaudhuri
*Assistant Examiner*—Phat X. Cao
*Attorney, Agent, or Firm*—Ostrolenk, Faber, Gerb & Soffen, LLP

[57] ABSTRACT

A power MOS gated device having a polygonal cell structure is formed together with a Schottky diode in a common silicon substrate. The source contact metal of each polygonal cell also contacts the silicon substrate at the center of the cell to form the Schottky contact of the fast recovery Schottky diode. A notch is also formed in the top surface of the substrate through the source region, and the source contact metal fills the notch.

2 Claims, 5 Drawing Sheets

INTEGRATED SCHOTTKY DIODE AND MOSGATED DEVICE

FIELD OF THE INVENTION

This invention relates to MOSgated devices and more specifically relates to a cell pattern for MOSgated synchronous rectifier devices which produces a schottky diode element in each cell of the device.

BACKGROUND OF THE INVENTION

MOSgated devices, particularly power MOSFETs are frequently used as synchronous rectifiers. A synchronous rectifier acts like a diode and is turned on when its equivalent diode is to conduct and is turned off when the equivalent diode is to cease conduction. Vertical conduction MOSFETs have an inherent body diode which, because it is relatively slow, increases reverse recovery losses and interferes with the operation of the device as a synchronous rectifier. More generally, such power MOSFETs have a given recovery loss. It is always useful to reduce this loss.

BRIEF DESCRIPTION OF THE INVENTION

In accordance with the present invention, a conventional MOSgated cell structure and manufacturing process is employed, where however the source contact makes a schottky contact to each cell of a cellular device and the inherent P/N body diode of the cell is deactivated. A schottky rectifier is a fast recovery device and has reduced recovery losses. Consequently, the MOSFET has a high speed schottky diode in parallel therewith to improve the device operation including its improved operation as a synchronous rectifier. The new device is also capable of being manufactured by existing processes with only slight modifications, such as the process disclosed in copending application Ser. No. 08/299,533, filed Sep. 1, 1994 (IR-1113).

DETAILED DESCRIPTION OF THE DRAWINGS

Figure 1:
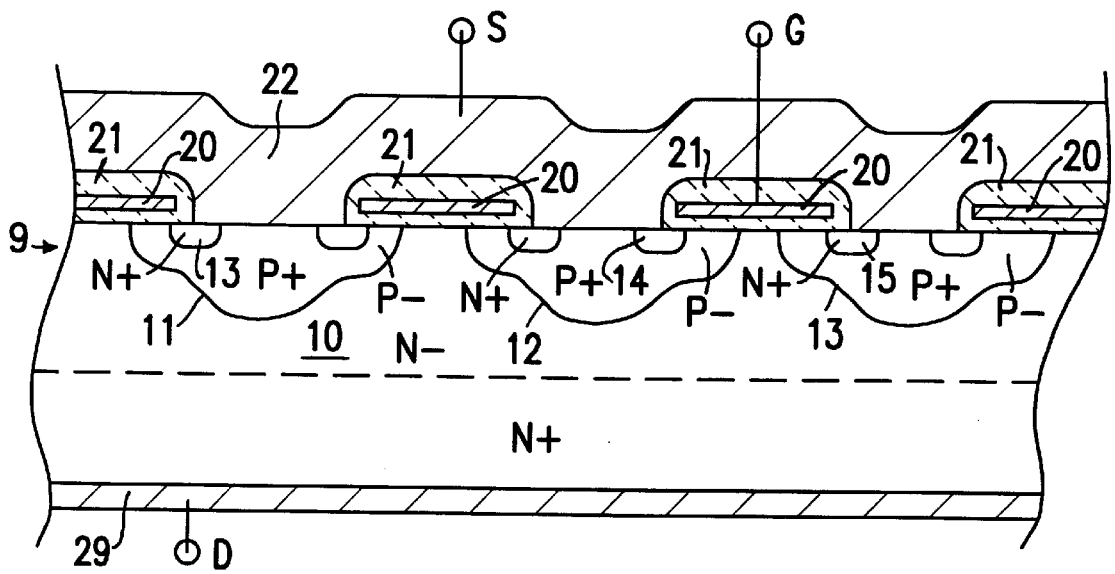
FIG. 1 is a cross-section of a small portion of a prior art MOSFET chip.

Referring first to FIG. 1, there is shown a small portion of MOSgated device chip 10 which has the junction pattern of a power MOSFET. Note that the invention can be used with other MOSgated devices. The chip 9 contains an N⁻ epitaxial region 10 formed atop the N⁺ body. Region 10 receives a plurality of spaced P base regions 11, 12 and 13 (for an N channel device) which may be cellular as is described in U.S. Pat. No. 5,008,725. Thus, the bases 11, 12 and 13 have a polygonal topology and have P⁺ central regions and peripheral P⁻ annular channels. Each base 11, 12 and 13 receives an annular N⁺ source 14, 15 and 16, respectively, to define the P⁻ annular channels. Each channel region is covered by a gate oxide or other gate dielectric which is in turn covered conventionally by a polysilicon gate mesh 20 as shown in FIG. 1. A low temperature oxide 22 covers the gate mesh and insulates the mesh from an aluminum source electrode 22. The oxide 22 and the gate oxide is conventionally patterned to permit the source contact 22 to contact each source contact 13, 14 and 15 and each respective P⁺ base region at the surface of the epitaxial region 10. A drain contact 29 is applied to the bottom of chip 9.

Figure 2:
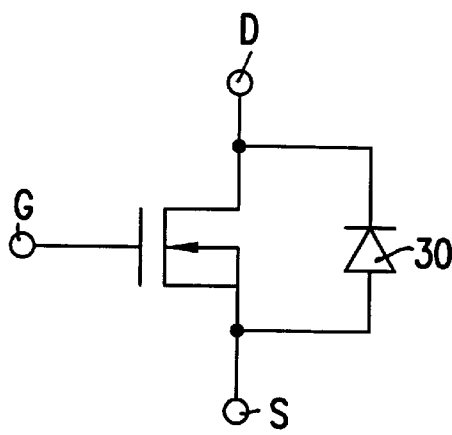
FIG. 2 is a circuit symbol for the device of FIG. 1.

The purpose of the P⁺ central region is to act as a good contact to the source metal, to enable contact between the N⁺ source region and the P⁺ base region, to deactivate the parasitic bipolar transistor formed by the diffusion pattern, and to reduce the resistance Rb' under the source as much as possible. The contact to the central P⁺ regions creates an inherent diode 30 (FIG. 2) for each cell, consisting of source contact 22, P⁺ regions 11, 12 and 13, N⁻ region 10, the N⁺ body and drain contact 29.

The inherent diode 30 in a power MOSFET has certain recovery losses. These recovery losses frequently limit the use of the device in certain applications, such as for a synchronous rectifier. The present invention replaces the PN diode 30 of FIGS. 1 and 2 by a high speed, low loss schottky diode 31 as shown in FIG. 3a.

Figure 3:
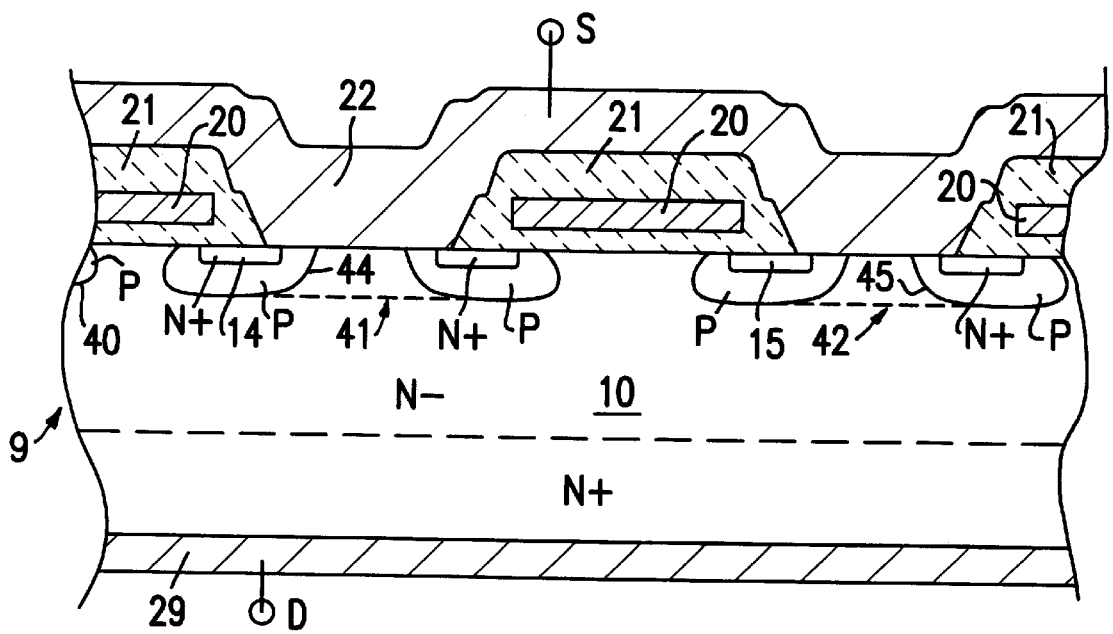
FIG. 3 is a cross-section of a chip containing the present invention and is a cross-section of FIG. 4 taken across section line 3—3 in FIG. 4.
Figure 4:
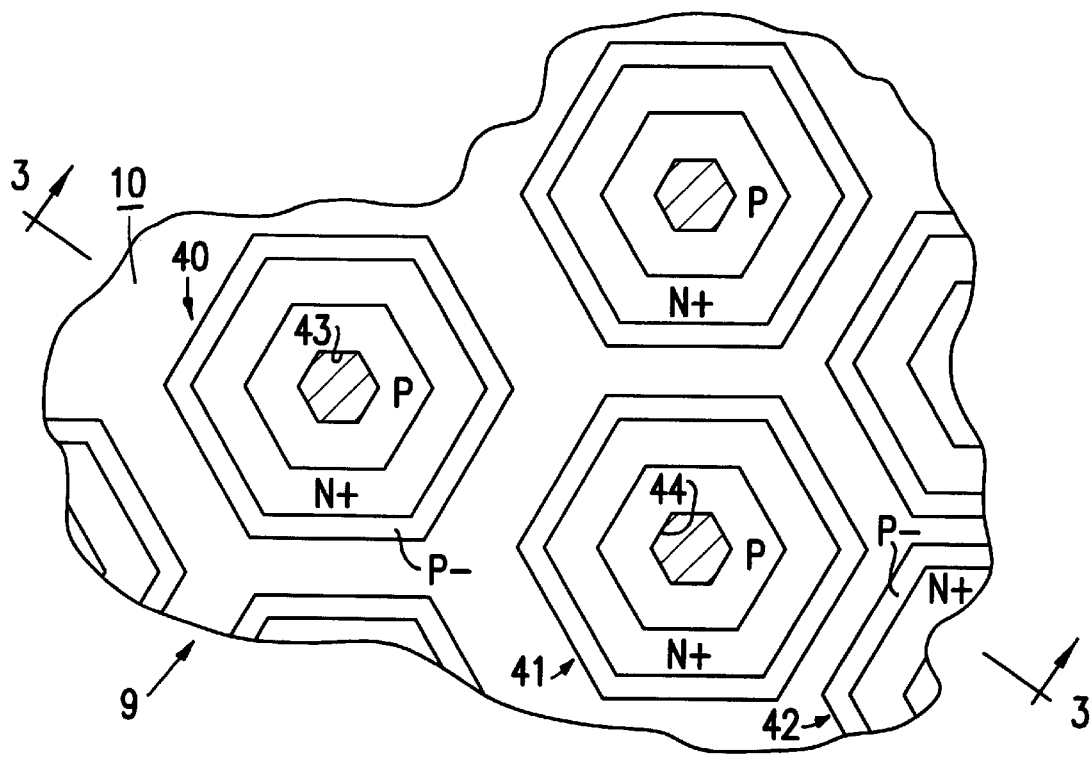
FIG. 4 is a top view of the topology of the diffusions in FIG. 3.
Figure 3A:
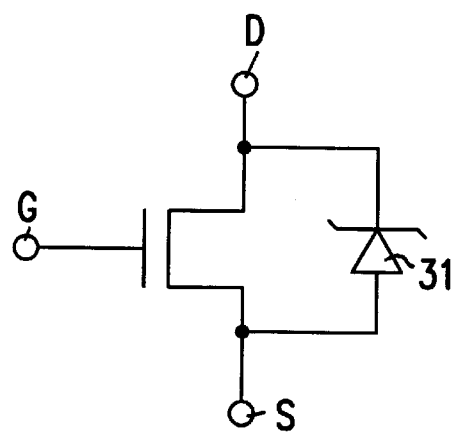
FIG. 3a is a circuit symbol for the device of FIG. 3.

FIGS. 3 and 4 show a junction pattern similar to that of FIG. 1, and similar numerals identify similar elements. In FIGS. 3 and 4, the base geometry is changed, and P bases 40, 41 and 42, for example, have central openings 43, 44 and 45 respectively through which the N⁻ material of epi 10 protrudes, so that the contact metal 22 contacts the N⁻ epi 10. The contact 22, if aluminum, then forms a schottky diode barrier to the silicon to define the device shown in FIG. 3a in which a fast recovery schottky diode 31 is in parallel with the MOSFET section of the device.

Note that metals other than aluminum can be used for the source metal 22, such as molybdenum, platinum, palladium, chromium, vanadium and generally any high work function material which contacts the N⁻ epi 10. Further, while the invention has been described for a cellular structure, it can also apply to any other topology, such as an interdigitated arrangement.

Figure 5:
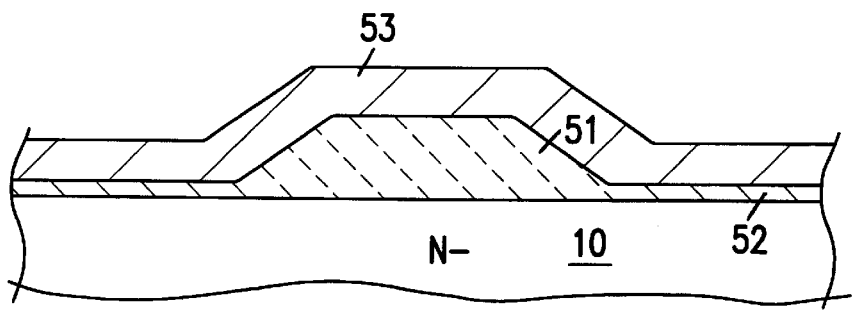
FIGS. 5, 6 and 7 show a portion of a chip at different process stages for the manufacture of a junction pattern in accordance with the invention.
Figure 6:
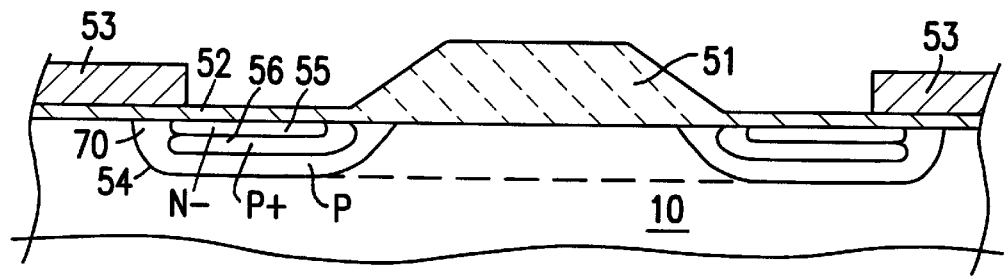
Figure 7:
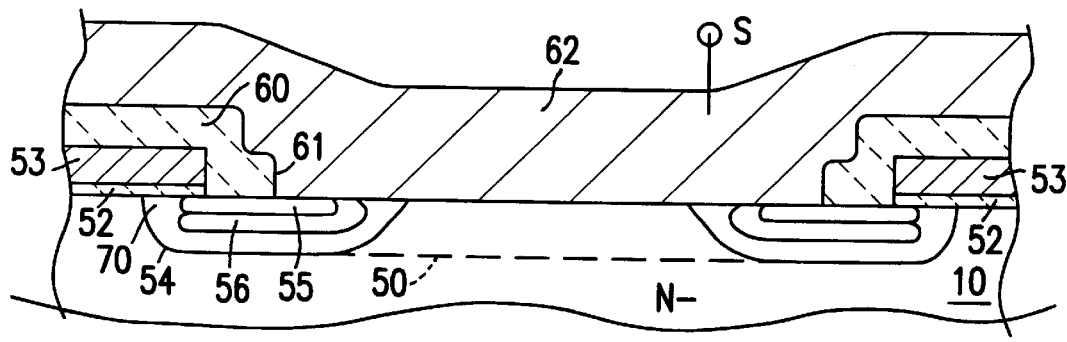

FIGS. 5, 6 and 7 show one process by which the general cell pattern of FIG. 3 can be produced, shown as cell 50 in FIG. 7. Thus, in FIG. 5, there is shown the N⁻ epi region 10 following a number of process steps which included:

a) a field oxide 51;
b) a mask step and etch which defines the field oxide 51 pattern shown in FIG. 5;
c) the deposition or growth of gate oxide 52; and
d) the deposition of conductive polysilicon 53.

The pattern of FIG. 6 is then formed, using the following sequential steps:

a) a mask and etch of polysilicon 53;
b) a boron channel implant and drive to form the P type diffusion annulus 54 which forms the base cell;
c) an N⁺ implant and drive to form the N⁺ source annulus 55;
d) a P⁺ implanted annulus 56.

The step of FIG. 6 is then followed by the following steps, shown in FIG. 7 to produce the final cell structure:

a) the deposition of low temperature oxide (LTO) 60 over the entire surface of FIG. 6;

b) the densification of the LTO;

c) a metal mask and oxide etch to open a central window 61 in the LTO (for each cell);

d) the deposition of a source metal 62, preferably aluminum.

The final device of FIG. 7 is one of a large number of MOSFET cells having annular invertible channels 70 under the MOSgate 52, 53. Since the aluminum 62 contacts N⁻ epi 10, the desired schottky diode is formed in parallel with the MOSFET.

Figure 8:
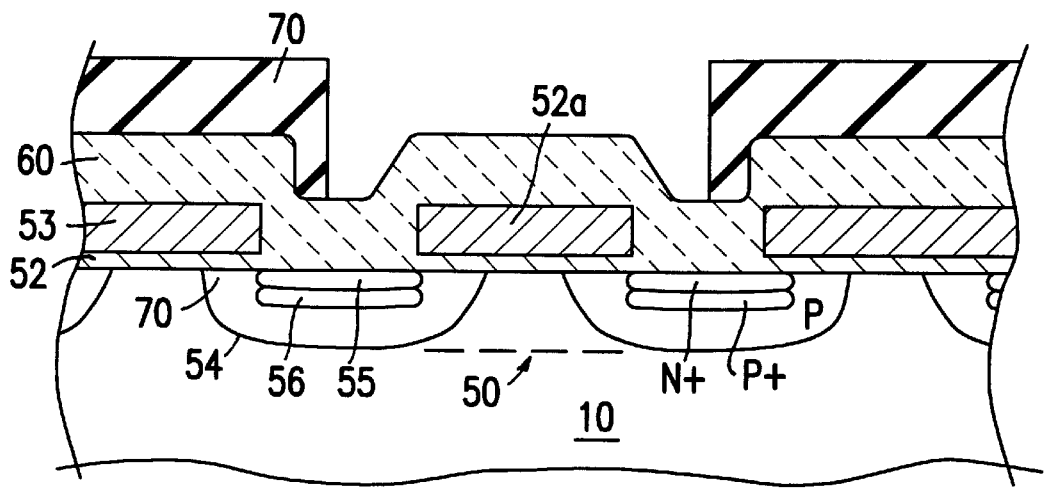
FIGS. 8 and 9 show a further process sequence for the manufacture of a device in accordance with the invention.
Figure 9:
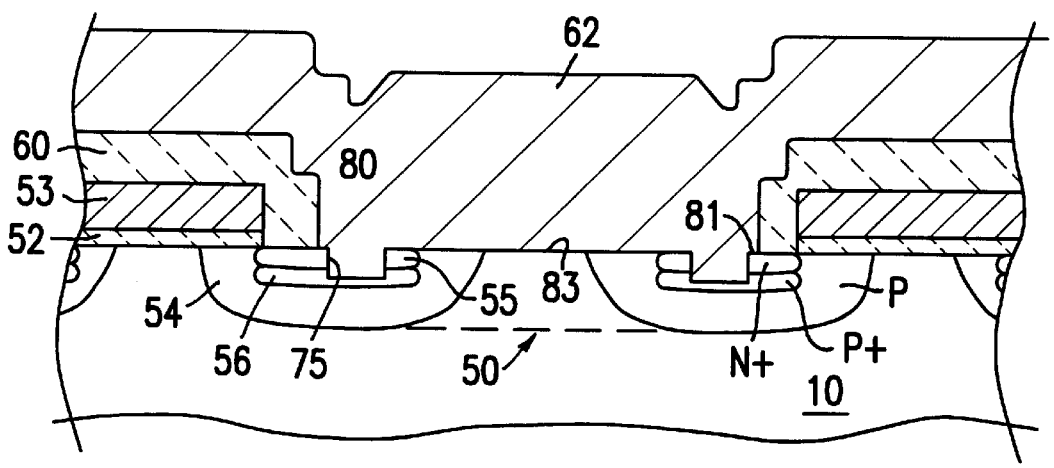

FIGS. 8 and 9 show the formation of a cell made in accordance with the invention using a process based on the process disclosed in U.S. Pat. No. 5,795,793, issued Aug. 18, 1998. In FIGS. 8 and 9, components similar to those of FIGS. 5 to 7 have the same identifying numerals. The process differs in that, instead of a field oxide mask 51 to prevent diffusion into the center of the cell 50, a portion of the polysilicon 52a (FIG. 8) remains in place after the polysilicon etch step (which was described in FIG. 6). As further shown in FIG. 8, a patterned photoresist 70 is used to define an oxide etch which etches the LTO 60 out of an annular area in the central cell area and exposes an annular opening which reaches the silicon surface.

Thereafter, a silicon etch is used to etch an annular notch 75 (FIG. 9) in the silicon surface which cuts through N⁺ region 55 and into P⁺ implant 56.

Thereafter, the polysilicon plug 52a is etched away, and an oxide etch is employed to cut back the interior diameter 80 of the LTO window to expose a short shelf 81 of the silicon surface adjacent the notch 75.

Thereafter, the aluminum or other metal contact 62 is deposited on the upper surface, making contact within notch 75 to N⁺ region 55, P⁺ region 56 and P region 54, and further making a schottky contact to N⁻ silicon surface 83.

Figure 10:
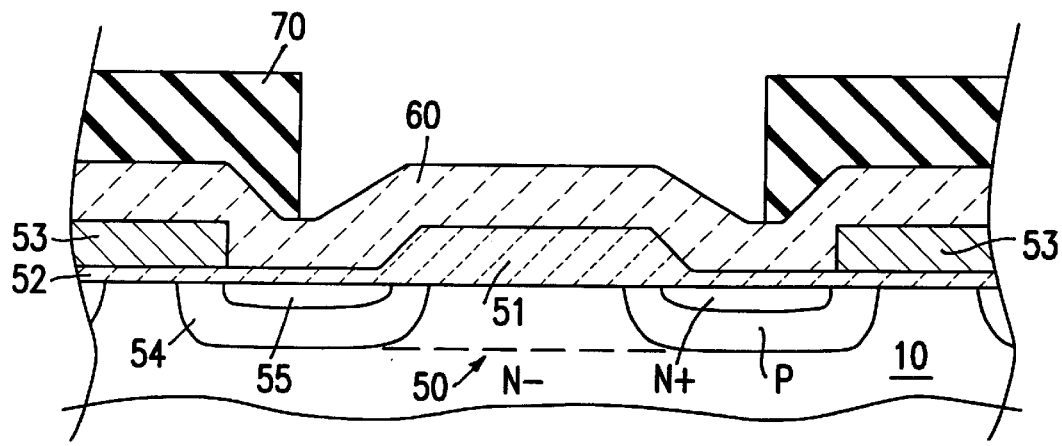
FIGS. 10 to 12 show a still further process sequence for the manufacture of a device in accordance with the invention.
Figure 11:
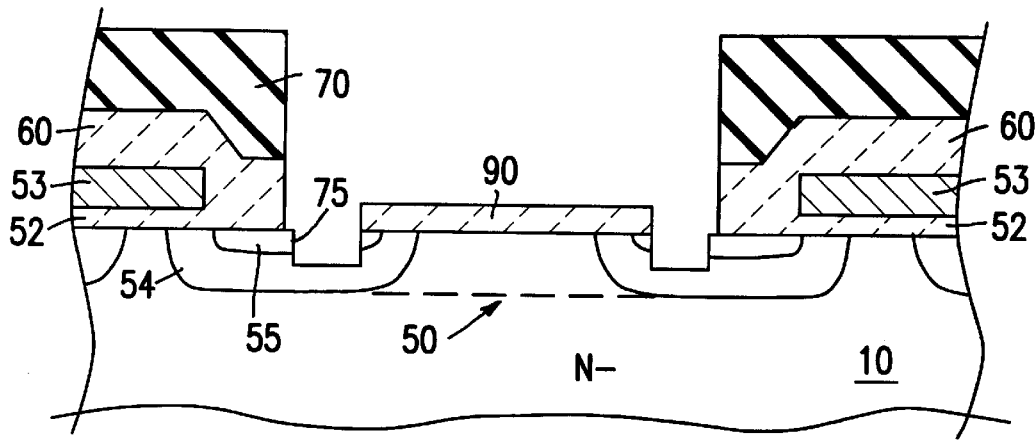
Figure 12:
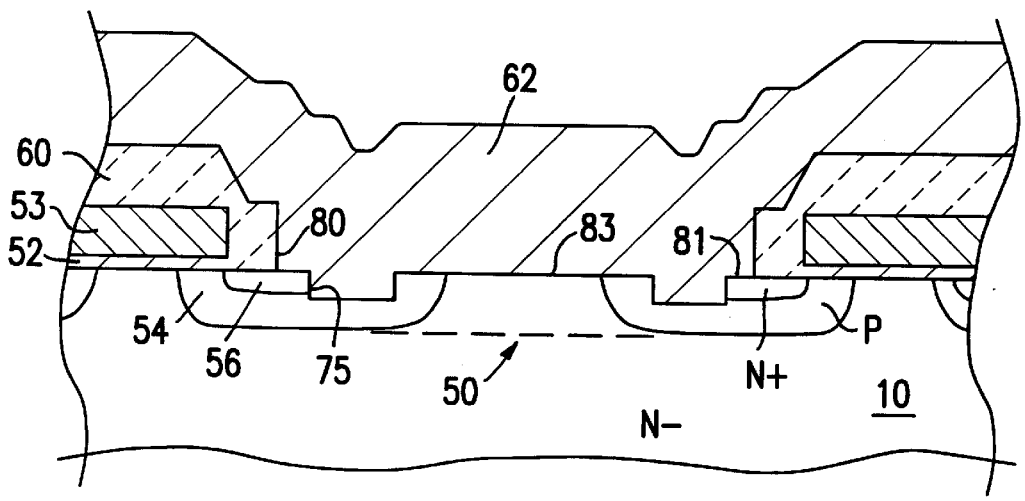

FIGS. 10, 11 and 12 show a still further process flow for forming the novel MOSFET with integral schottky diode structures. The numerals used in FIGS. 10 to 12 which are the same as those in FIGS. 5 to 9 identify similar elements.

The device at the stage of FIG. 10 is similar to that of FIG. 6, except that P⁺ region 56 is eliminated, and photoresist 70 is in place prior to the LTO 60 etch shown in FIG. 7. An oxide etch is then used in FIG. 11 to etch the exposed LTO 60, but leaving a residual oxide layer 90 which is the bottom of field oxide 51. Thereafter, a silicon etch forms annular notch 75 in the silicon surface as in FIG. 9. The photoresist 70 is then stripped and a subsequent oxide etch is used to etch back LTO window 80 and expose shelf 81 to remove oxide button 90.

Thereafter, an aluminum or other metal is deposited on the upper surface of the chip, making contact to regions 54 and 56, and making a schottky contact to N⁻ surface 83.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. In combination, a power MOSgated device and a schottky diode; said power MOSgated device comprising at least one annular diffusion region which includes an invertible channel region and which is disposed in a surface of a semiconductor chip, a source region connected to one side of said invertible channel region, a drain region connected to another side of said invertible channel region, a further diffusion region formed directly beneath and contacting all of a bottom surface of said source region and being more heavily doped than said annular diffusion region, said annular diffusion region being wider and deeper than said further diffusion region, an insulated gate disposed atop said at least one invertible channel region and being adapted to invert said invertible channel region under predetermined conditions; an annular shaped notch formed in said surface of said semiconductor chip and extending from said surface through said source region and into said further diffusion region; and a contact metal formed atop said source region and in said annular shaped notch and contacting said source region at said ton surface of said semiconductor chip adjoining said annular notch and at a sidewall of said annular notch; an integral portion of said contact metal being connected to said surface of said semiconductor chip at a region laterally removed from said source region; said source region, said at least one invertible channel region, said insulated drain region and said drain region defining said MoSgated device; said portion of said contact metal in contact with said surface of said semiconductor chip defining a schottky contact connected in parallel with said MoSgated device.

2. A MOSgated device having low recovery loss comprising, in combination: an epitaxially formed substrate having surface for receiving junctions and having a first conductivity type; at least one polygonal base region of a second conductivity type diffused into said substrate surface; at least one annular source region of said first conductivity type diffused into said base region and defining an invertible channel region at an outer periphery of said base region; a further diffusion region formed directly beneath and contacting all of a bottom surface of said source region and being more heavily doped than said polygonal base region, said polygonal base region being wider and deeper than said annular diffusion region; an insulated gate structure overlying said invertible channel region and having an opening therein at regions enclosed by and removed from said source region and that exposes said surface of said epitaxially formed substrate; an annular shaped notch formed in said substrate surface and extending from said surface through said source region and into said further diffusion region; a source contact metal formed atop said substrate and in said annular shaped notch and contacting said source region at said top surface of said semiconductor chip adjoining said annular notch and at a sidewall of said annular notch, said further diffusion region at a bottom surface of said annular notch and said base region at said surface of said substrate which is exposed by said opening; said contact between said source contact metal and said surface of said epitaxially formed substrate defining a schottky diode.

* * * * *